(12) United States Patent
Friegel et al.

(10) Patent No.: US 10,988,047 B2
(45) Date of Patent: Apr. 27, 2021

(54) METHOD FOR DETERMINING A CAPACITY OF A BATTERY CELL, EVALUATION DEVICE, MONITORING APPARATUS, HIGH-VOLTAGE BATTERY AND MOTOR VEHICLE

(71) Applicant: Bayerische Motoren Werke Aktiengesellschaft, Munich (DE)

(72) Inventors: Armin Friegel, Munich (DE); Bernhard Kreppold, Fuerstenfeldbruck (DE); Philipp Riemann, Munich (DE); Benno Schweiger, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 17/046,226

(22) PCT Filed: Aug. 27, 2019

(86) PCT No.: PCT/EP2019/072851
§ 371 (c)(1),
(2) Date: Oct. 8, 2020

(87) PCT Pub. No.: WO2020/052970
PCT Pub. Date: Mar. 19, 2020

(65) Prior Publication Data
US 2021/0031653 A1    Feb. 4, 2021

(30) Foreign Application Priority Data

Sep. 13, 2018  (DE) .................. 10 2018 215 575.5

(51) Int. Cl.
*B60L 58/12* (2019.01)
*H01M 10/48* (2006.01)
(Continued)

(52) U.S. Cl.
CPC ............ *B60L 58/12* (2019.02); *G01R 31/367* (2019.01); *G01R 31/387* (2019.01);
(Continued)

(58) Field of Classification Search
CPC ... B60L 58/12; H01M 10/48; H01M 2220/20; G01R 31/367; G01R 31/387; G01R 31/3842
(Continued)

(56) References Cited

U.S. PATENT DOCUMENTS 6,392,415 B2 * 5/2002 Laig-Horstebrock ....................... G01R 31/3828
324/433
8,384,390 B2 * 2/2013 Zhang .................. G01R 31/396
324/429
(Continued)

FOREIGN PATENT DOCUMENTS

CN       104395771 A      3/2015
DE    11 2009 001 553 T5    9/2011
(Continued)

OTHER PUBLICATIONS

International Search Report (PCT/ISA/210) issued in PCT Application No. PCT/EP2019/072851 dated Dec. 4, 2019 with English translation (five (5) pages).
(Continued)

*Primary Examiner* — M Baye Diao
(74) *Attorney, Agent, or Firm* — Crowell & Moring LLP

(57) ABSTRACT

A method determines a capacity of a battery cell of a high-voltage battery of a motor vehicle. The method receives at least three open-circuit voltage values of the battery cell; determines state of charge values of the battery cell from the open-circuit voltage values on the basis of a predetermined open-circuit voltage curve; forms at least two
(Continued)

pairs of values by combining in each case two of the at least three open-circuit voltage values; determines respective charge throughput values of the battery cell which are specific to the pairs of values by integrating a measured current of the battery cell over a period between two measuring times of the associated open-circuit voltage values; determines respective capacity raw values which are specific to the pairs of values on the basis of the associated charge throughput value which is specific to the pairs of values and the associated state of charge values which are specific to the pairs of values; and determines the capacity on the basis of the at least two capacity raw values which are specific to the pairs of values.

13 Claims, 2 Drawing Sheets

(51) Int. Cl.
 *G01R 31/3842* (2019.01)
 *G01R 31/387* (2019.01)
 *G01R 31/367* (2019.01)

(52) U.S. Cl.
 CPC ........ *G01R 31/3842* (2019.01); *H01M 10/48* (2013.01); *H01M 2220/20* (2013.01)

(58) Field of Classification Search
 USPC ............................................. 429/90
 See application file for complete search history.

(56) References Cited

U.S. PATENT DOCUMENTS

| | | | |
|---|---|---|---|
| 9,037,426 B2* | 5/2015 | Schaefer | B60L 58/22 |
| | | | 702/63 |
| 10,875,419 B2* | 12/2020 | Boeswald | B60L 53/65 |
| 2009/0322283 A1 | 12/2009 | Zhang et al. | |
| 2010/0224157 A1* | 9/2010 | Mizuno | G01R 31/389 |
| | | | 123/179.4 |
| 2014/0214347 A1* | 7/2014 | Laskowsky | G01R 31/3842 |
| | | | 702/63 |
| 2015/0066407 A1 | 3/2015 | Joe et al. | |
| 2016/0252582 A1 | 9/2016 | Iida et al. | |
| 2019/0293720 A1* | 9/2019 | Fujita | H01M 10/425 |

FOREIGN PATENT DOCUMENTS

| | | |
|---|---|---|
| DE | 10 2010 019 128 A1 | 11/2011 |
| DE | 10 2014 200 669 A1 | 7/2015 |
| GB | 2542212 A | 3/2017 |
| JP | 2012026771 A * | 2/2001 |
| JP | 2003-224901 A | 8/2003 |
| WO | WO-2017221899 A1 * | 12/2017 ............ H01M 10/48 |

OTHER PUBLICATIONS

German-language Written Opinion (PCT/ISA/237) issued in PCT Application No. PCT/EP2019/072851 dated Dec. 4, 2019 (seven (7) pages).

German-language Office Action issued in German Application No. 10 2018 215 575.5 dated May 27, 2019 with English translation (18 pages).

German-language Decision to Grant issued in German Application No. 10 2018 215 575.5 dated Aug. 2, 2019 with English translation (14 pages).

* cited by examiner

METHOD FOR DETERMINING A CAPACITY OF A BATTERY CELL, EVALUATION DEVICE, MONITORING APPARATUS, HIGH-VOLTAGE BATTERY AND MOTOR VEHICLE

BACKGROUND AND SUMMARY OF THE INVENTION

The invention relates to a method for determining a capacity of a battery cell of a high-voltage battery of a motor vehicle. The invention furthermore relates to an evaluation apparatus, to a monitoring device, to a high-voltage battery and to a motor vehicle.

What are of interest here are high-voltage batteries or high-voltage energy stores for electrically driveable motor vehicles, for example electric vehicles or hybrid vehicles. Such high-voltage batteries generally comprise a plurality of battery cells, for example Li-ion battery cells, that are arranged in an interior or reception space of a battery housing and connected there so as to form battery modules. In this case, the Li-ion battery cells are subject to ageing. This means that an available capacity of the battery cells drops with respect to an initial capacity or nominal capacity of the battery cells as the battery cells age. For many applications, for example for estimating the range of an electric vehicle, it is essential to know the actual currently available capacity of the battery cells. To this end, use is usually made of estimation methods that are based on determining the capacity from a charge throughput of the battery cells and two values of the state of charge. In order to determine the two state of charge values, the open circuit voltage or OCV of the battery cell is measured at two different measurement times. In order to determine the charge throughput, a measured current of the battery cell is integrated over a time interval between the two measurement points.

This method results in the disadvantage that measurement errors, which may be caused for example by sensor noise when recording the open circuit voltage and the current, have a large influence on the result of the capacity calculation. The capacity calculated in this way thus possibly does not correspond to the actual currently available capacity.

The object of the present invention is to provide a solution as to how a capacity of a battery cell of a high-voltage battery for a motor vehicle is able to be determined particularly easily, reliably and accurately.

This object is achieved according to the invention by a method, an evaluation apparatus, a monitoring device, a high-voltage battery and a motor vehicle having the features according to the respective independent patent claims. Advantageous embodiments of the invention are the subject matter of the dependent patent claims, the description and the figures.

The invention relates to a method for determining a capacity of a battery cell of a high-voltage battery of a motor vehicle. In this case, first of all at least three open circuit voltage values, measured at different measurement times, of the battery cell are received and at least three state of charge values of the battery cell are determined from the open circuit voltage values on the basis of a predetermined open circuit voltage curve that describes a relationship between the open circuit voltage and the state of charge of the battery cell. At least two pairs of values of the open circuit voltage or of the state of charge are furthermore determined by combining in each case two of the at least three open circuit voltage values or state of charge values. Furthermore, respective charge throughput values, specific to the pairs of values, of the battery cell are determined by integrating a measured current of the battery cell over a time interval between the two measurement times of the associated open circuit voltage values. Finally, respective capacity raw values specific to the pairs of values are determined based on the associated charge throughput value specific to the pairs of values and the associated state of charge values specific to the pairs of values, and the capacity is determined based on the at least two capacity raw values specific to the pairs of values.

The invention furthermore relates to an evaluation apparatus for a monitoring device for monitoring a high-voltage battery of a motor vehicle, which evaluation apparatus is designed to perform a method according to the invention. A monitoring device according to the invention for monitoring a high-voltage battery of a motor vehicle comprises at least one voltage sensor for recording at least three open circuit voltage values of a battery cell of the high-voltage battery at different measurement times, at least one current sensor for recording a current of the battery cell and an evaluation apparatus according to the invention.

The invention furthermore encompasses a high-voltage battery having a multiplicity of battery cells and a monitoring device according to the invention. A motor vehicle according to the invention comprises a high-voltage battery according to the invention. The motor vehicle is in particular a passenger vehicle in the form of an electric or hybrid vehicle.

The embodiments set forth below with reference to the method according to the invention and its advantages apply analogously to the evaluation apparatus according to the invention, to the monitoring device according to the invention, to the high-voltage battery according to the invention and to the motor vehicle according to the invention.

The battery cell whose capacity is monitored is in particular a Li-ion battery cell of the high-voltage battery. The high-voltage battery is in particular a traction battery for a motor vehicle designed as an electric or hybrid vehicle. In the battery cell, the open circuit voltage and the current consumed by the battery cell are first of all measured over a predetermined measurement time interval. All of the battery cells of the high-voltage battery may in particular be monitored. To this end, the monitoring device may record the current and the open circuit voltage for each battery cell. In the case of a series connection of the battery cells, the monitoring device, in order to record the current, may have a current sensor that measures the current flowing through the series connection as the current of the battery cell to be monitored. In order to record the open circuit voltage, the monitoring device may have a voltage sensor for each battery cell. The current sensor and the voltage sensors may communicate the respective measured values to the evaluation apparatus of the monitoring device. The evaluation apparatus may be for example a superordinate evaluation apparatus for all of the battery cells of the high-voltage battery and be integrated into a battery controller of the high-voltage battery.

The measurement time interval is in this case selected such that the capacity of the battery cell does not change, or changes only insignificantly, during this time. By way of example, the measurement time interval may be one week at most. During this measurement time interval, values of the open circuit voltage or of the quiescent voltage are recorded at least three measurement times. A first open circuit voltage value is thus recorded at a first measurement time, a second open circuit voltage value is recorded at a second measurement time and a third open circuit voltage value is recorded at least one third measurement time. The state of charge value of the battery cell is then determined for each open circuit voltage value. The state of charge values are in this case determined or read from the predetermined open circuit voltage curve. The open circuit voltage curve or open circuit voltage function is predetermined for the respective battery cell and describes the relationship between the open circuit voltage and the state of charge. In the open circuit voltage curve, a state of charge value is thus assigned uniquely to each open circuit voltage value. The open circuit voltage curve may be stored or saved for example in a storage apparatus of the high-voltage battery and be read by the evaluation apparatus.

The at least two pairs of values are formed from these at least three open circuit voltage values or state of charge values. It is pointed out that the order of the steps described above is not mandatory. The pairs of values may for example first of all be determined from the recorded open circuit voltage values and the state of charge values specific to the pairs of values may then be determined. It may however also be the case that the state of charge values are first of all determined from the open circuit voltage values and pairs of values are then formed from the state of charge values. By way of example, a first pair of values that comprises the first and the second open circuit voltage value or state of charge value is formed, and a second pair of values that comprises the second and the third open circuit voltage value or state of charge value is formed. As an alternative to the first or the second pair of values or in addition to the two pairs of values, a third pair of values that comprises the first and the third open circuit voltage value or state of charge value may be formed.

A charge throughput value is furthermore determined for each of the formed pairs of values. To this end, the current that was consumed by the battery cell between the measurement times of the open circuit voltage of this pair of values is recorded. A number of charge throughput values, corresponding to the number of pairs of values, is thus determined, wherein each charge throughput value is specific to a pair of values. A capacity raw value is then determined for each pair of values. The capacity raw value specific to the pairs of values is in this case determined on the basis of the charge throughput value determined for this pair of values and on the basis of the state of charge values determined for this pair of values. The respective capacity raw values specific to the pairs of values are in particular determined as the quotient between the associated charge throughput value specific to the pairs of values and the difference between the state of charge values specific to the pairs of values.

After the capacity raw values are determined, the currently available current capacity of the battery cell is determined. In this case, in order to determine the capacity, at least two capacity raw values that have been calculated from two different pairs of values of the open circuit voltage are available. On the basis of the capacity, it is then possible for example to determine a state of health of the battery cell as the ratio between the determined capacity and a nominal capacity of the battery cell.

Using the plurality of pairs of values or value combinations results in the advantage that measurement errors have less of an impact on the overall result of the capacity determination. The result of the capacity determination thereby becomes more accurate, such that for example ageing of the battery cell is able to be forecast reliably.

The capacity raw values are preferably determined in parallel. This means that the capacity raw values are determined in method steps that take place in parallel, for example at the same time. The capacity is thus not determined iteratively based on in each case two state of charge values, but rather the capacity is determined based on at least two currently present capacity raw values, wherein the capacity raw values are in each case determined from two different state of charge values.

Particularly preferably, the binomial coefficient is determined on the basis of a number of the recorded open circuit voltage values and a number, corresponding to the binomial coefficient, of pairs of values of the open circuit voltage or of the state of charge is determined. The binomial coefficient is determined as $$\frac{n!}{2(n-2)!}$$

(where n is the number of recorded open circuit voltage values) and describes the number of combination possibilities for two open circuit voltage values without repetition. For example, for five open circuit voltage values, that is to say n=5, ten combinations are already possible. Ten pairs of values and therefore ten capacity raw values, on the basis of which the currently available capacity of the battery cell is then determined or estimated, may thus be determined. Forming a maximum possible number of pairs of values advantageously makes it possible to determine a particularly accurate value of the capacity with reduced errors.

In one embodiment of the invention, the capacity is determined as a mean value of the determined capacity raw values. In the simplest case, the arithmetic mean may thus for example be determined from the capacity raw values by summing the capacity raw values and dividing the sum by the number of capacity raw values. The capacity is thus able to be determined based on the capacity raw values particularly easily and quickly.

The capacity is preferably determined using an optimization method, in particular using the least squares method. Using the optimization method, the capacity is thus determined on the basis of the capacity raw values such that an overall estimation error is minimal. The capacity is thus able to be determined particularly accurately and reliably.

In one particularly advantageous embodiment of the invention, in addition to the at least two capacity raw values specific to the pairs of values, at least one capacity raw value based on a model is determined, wherein the capacity raw value based on a model is determined on the basis of at least one measured loading of the battery cell and on the basis of a predetermined battery cell model depending on the loading of the battery cell, and wherein the capacity is determined based on the at least two capacity raw values specific to the pairs of values and the at least one capacity raw value based on a model. The battery cell model may be for example a statistical ageing forecasting model and describes the dependency of the capacity of the battery cell on the loading of the battery cell during operation. The battery cell model may for example be predetermined and validated for the battery cell during development of the battery cell and be stored in the storage apparatus. In order then to determine the capacity raw value based on a model during operation of the high-voltage battery, the loading of the battery cell, for example a charge throughput and/or a temperature profile and/or state of charge residence times of the battery cell, may be measured and populated into the battery cell model as input variable. The battery cell model outputs a capacity raw value specific to a model as output variable. The at least one capacity raw value specific to a model and calculated on the basis of the battery cell model and the at least two capacity raw values specific to the pairs of values may then be fused or combined in order to determine the capacity of the battery cells.

By way of example, a plurality of capacity raw values specific to a model may be determined for different time intervals, such that the capacity raw values specific to a model each correspond to a pair of values and thus each correspond to a capacity raw value specific to the pairs of values. By way of example, to this end, a first temperature profile may be determined between the first and the second measurement time and at least one second temperature profile may be determined between the second and the third measurement time. On the basis of the temperature profiles and of the battery cell model, it is then possible to determine two capacity raw values specific to a model and that are then fused with the capacity raw values specific to the pairs of values.

Further features of the invention will become apparent from the claims, the figures and the description of the figures. The features and combinations of features mentioned above in the description and the features and combinations of features mentioned below in the description of the figures and/or shown on their own in the figures may be used not only in the respectively specified combination, but also in other combinations or on their own.

The invention will now be explained in more detail on the basis of one preferred exemplary embodiment and with reference to the drawings.

BRIEF DESCRIPTION OF THE DRAWINGS

Identical and functionally identical elements are provided with the same reference signs in the figures.

DETAILED DESCRIPTION OF THE DRAWINGS

Figure 1:
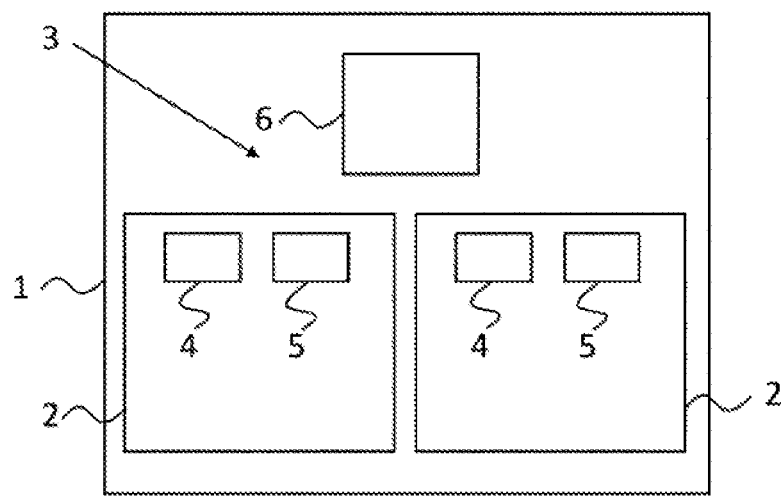
FIG. 1 is a schematic illustration of one embodiment of a high-voltage battery according to the invention.

FIG. 1 shows a schematic illustration of a high-voltage battery 1 according to one embodiment of the present invention. The high-voltage battery 1 may for example be a traction battery of an electrically driveable motor vehicle that is not shown here. The high-voltage battery 1 has a plurality of battery cells 2 that are connected in series here, and a monitoring device 3 that is designed to estimate or to determine a respective capacity of the battery cells 2. A state of health or SOH of the battery cells 2 is able to be determined on the basis of the capacity of the battery cells 2. The monitoring device 3 in this case has, for each battery cell 2, a voltage sensor 4 for recording an open circuit voltage of the battery cell 2. The monitoring device 3 furthermore has a current sensor 5 for recording a current of the battery cells 2. The measured values recorded by the voltage sensors 4 and the current sensor 5 may be transmitted to an evaluation apparatus 6, which is designed here as a superordinate evaluation apparatus, of the monitoring device 3, which determines the capacities of the battery cells 2 based on the measured values.

Figure 2:
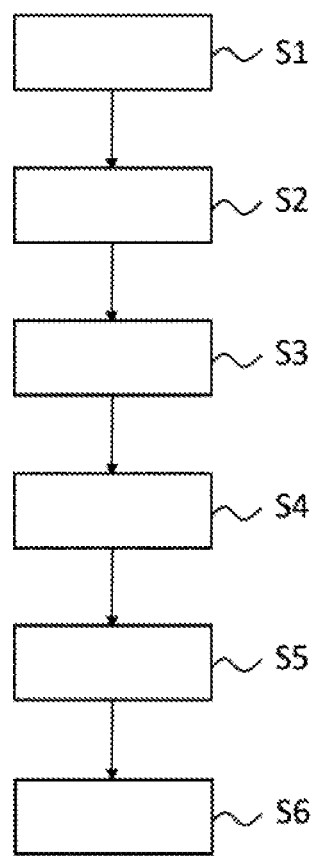
FIG. 2 is a flowchart containing method steps of one embodiment of a method according to the invention.
Figure 3:
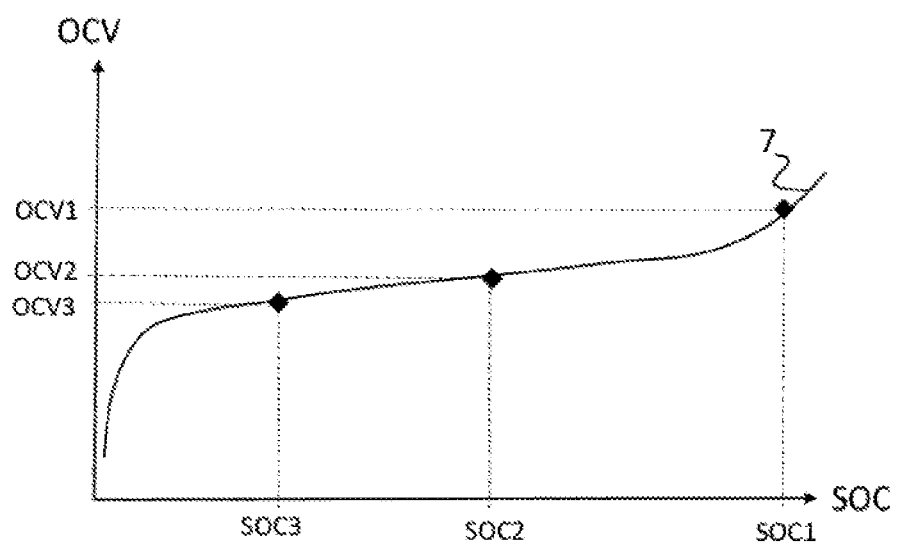
FIG. 3 is a schematic illustration of an open circuit voltage curve.

To this end, the evaluation apparatus 6 performs a method whose steps are explained on the basis of the flowchart according to FIG. 2. In a first step S1, open circuit voltage values that have been recorded at least three different measurement times are received by the evaluation apparatus 6. In a second step S2, an open circuit voltage curve 7, which is illustrated in FIG. 3, is used to determine state of charge values from the open circuit voltage values. A relationship between the open circuit voltage OCV and the state of charge SOC is established in the open circuit voltage curve. For the three recorded open circuit voltage values OCV1, OCV2 and OCV3, the respective associated state of charge values SOC1, SOC2 and SOC3 are read from the open circuit voltage curve 7. The open circuit voltage curve 7 is predetermined and may for example be stored in a storage apparatus, able to be read by the evaluation apparatus, of the monitoring device 3.

The at least three open circuit voltage values OCV1, OCV2, OCV3 or the at least three state of charge values SOC1, SOC2, SOC3 are combined to form at least two pairs of values in a third step S3. By way of example, three pairs of values may be formed on the basis of the three open circuit voltage values OCV1, OCV2, OCV3 or the at least three state of charge values SOC1, SOC2, SOC3, wherein two different open circuit voltage values OCV1, OCV2, OCV3 and two different state of charge values SOC1, SOC2, SOC3 and the associated measurement times are assigned to each pair of values.

In a fourth method step S4, a charge throughput value is determined per pair of values. To this end, the current, recorded by the current sensor 5, of a battery cell 2 is integrated over the time interval between the measurement times of the two open circuit voltage values OCV1, OCV2, OCV3 of the respective pair of values. A capacity raw value for each pair of values is determined in a fifth step S5 on the basis of the charge throughput value and on the basis of the state of charge values SOC1, SOC2, SOC3 of a pair of values. The capacity raw value $C_{roh}$ is determined for example for a pair of values with the state of charge values SOC1 and SOC2 and the charge throughput value Q using the formula $$C_{roh} = \frac{Q}{SOC1 - SOC2}.$$

Three capacity raw values are thus determined in the case of three pairs of values.

In a sixth method step S6, the capacity of the respective battery cell 2 is determined from the capacity raw values. By way of example, the capacity C may be determined by minimizing the overall estimation error using an optimization method:

$$\min_{C \in \mathbb{R}} \sum_{i=1,\ldots n} |C_{roh,i} - C|,$$

where n is the number of capacity raw values. There may however also be provision to use other optimization methods, for example the least squares method, or calculating the mean of the capacity raw values in order to determine the capacity.

In an optional step performed before the sixth step S6, in addition to the capacity raw values specific to the pairs of values, capacity raw values specific to a model may also be determined. These capacity raw values specific to a model may be determined from a predetermined battery cell model that describes the load-dependent capacity of the battery cell 2. To this end, a temperature profile of the battery cell 2 is measured, for example by way of a temperature sensor of the battery cells 2, as the loading, and the capacity raw value specific to a model is determined on the basis of the measured temperature profile by way of the battery cell model. This capacity raw value specific to a model and the capacity raw values specific to the pairs of values may be then be fused to give the capacity.

LIST OF REFERENCE SIGNS

1 High-voltage battery
2 Battery cells
3 Monitoring device
4 Voltage sensor
5 Current sensor
6 Evaluation apparatus
7 Open circuit voltage curve
OCV Open circuit voltage
OCV1, OCV2, OCV3 Open circuit voltage values
SOC State of charge
SOC1, SOC2, SOC3 State of charge values
S1, S2, S3, S4, S5, S6 Method steps

What is claimed is:

1. A method for determining a capacity of a battery cell of a high-voltage battery of a motor vehicle, comprising the steps of:
  receiving at least three open circuit voltage values, measured at different measurement times, of the battery cell;
  determining state of charge values of the battery cell from the at least three open circuit voltage values on the basis of a predetermined open circuit voltage curve that describes a relationship between the open circuit voltage and the state of charge of the battery cell;
  forming pairs of values of the open circuit voltage or of the state of charge by combining in each case two of the at least three open circuit voltage values or state of charge values, wherein a binomial coefficient is determined on the basis of a number of the received open circuit voltage values and a number, corresponding to the binomial coefficient, of pairs of values is determined;
  determining respective charge throughput values, specific to the pairs of values, of the battery cell by integrating a measured current of the battery cell over a time interval between the two measurement times of the associated open circuit voltage values;
  determining respective capacity raw values specific to the pairs of values based on the associated charge throughput value specific to the pairs of values and the associated state of charge values specific to the pairs of values; and
  determining the capacity of the battery cell based on the at least two capacity raw values specific to the pairs of values.

2. The method according to claim 1, wherein
  the respective capacity raw values specific to the pairs of values are determined in parallel.

3. The method according to claim 1, wherein
  the respective capacity raw values specific to the pairs of values are determined as a quotient between an associated charge throughput value specific to the pairs of values and the difference between the state of charge values specific to the pairs of values.

4. The method according to claim 1, wherein
  the capacity is determined as a mean value of the determined capacity raw values specific to the pairs of values.

5. The method according to claim 1, wherein
  the capacity is determined using an optimization method.

6. The method according to claim 1, wherein
  the capacity is determined using a least squares method.

7. The method according to claim 1, wherein
  in addition to the at least two capacity raw values specific to the pairs of values, at least one capacity raw value based on a battery cell model is determined,
  the at least one capacity raw value based on the battery cell model is determined on the basis of at least one measured loading of the battery cell and on the basis of a predetermined battery cell model depending on the at least one loading of the battery cell, and
  the capacity is determined based on the at least two capacity raw values specific to the pairs of values and the at least one capacity raw value based on the battery cell model.

8. The method according to claim 7, wherein
  the battery cell model is a statistical model that describes a dependency of the capacity of the battery cell on the loading of the battery cell.

9. The method according to claim 7, wherein
  a charge throughput, a temperature profile and/or state of charge residence times of the battery cell are recorded as the loading.

10. An evaluation apparatus for a monitoring device for monitoring a high-voltage battery of a motor vehicle, which evaluation apparatus is configured to:
  receive at least three open circuit voltage values, measured at different measurement times, of the battery cell;
  determine state of charge values of the battery cell from the at least three open circuit voltage values on the basis of a predetermined open circuit voltage curve that describes a relationship between the open circuit voltage and the state of charge of the battery cell;
  form at least two pairs of values of the open circuit voltage or of the state of charge by combining in each case two of the at least three open circuit voltage values or state of charge values, wherein a binomial coefficient is determined on the basis of a number of the received open circuit voltage values and a number, corresponding to the binomial coefficient, of pairs of values is determined;
  determine respective charge throughput values, specific to the pairs of values, of the battery cell by integrating a measured current of the battery cell over a time interval between the two measurement times of the associated open circuit voltage values;
  determine respective capacity raw values specific to the pairs of values based on the associated charge throughput value specific to the pairs of values and the associated state of charge values specific to the pairs of values; and
  determine the capacity of the battery cell based on the at least two capacity raw values specific to the pairs of values.

11. A monitoring device for monitoring a high-voltage battery of a motor vehicle, comprising:
  a voltage sensor for measuring at least three open circuit voltage values of a battery cell at different times;
  a current sensor for recording a current of the battery cell; and
  an evaluation apparatus according to claim 10.

12. A high-voltage battery for a motor vehicle, comprising:
 a multiplicity of battery cells: and
 a monitoring device according to claim 11.

13. A motor vehicle comprising a high-voltage battery according to claim 12.

* * * * *